(12) United States Patent
Agarwal et al.

(10) Patent No.: US 8,382,999 B2
(45) Date of Patent: Feb. 26, 2013

(54) PULSED PLASMA HIGH ASPECT RATIO DIELECTRIC PROCESS

(75) Inventors: Ankur Agarwal, San Jose, CA (US);
Kenneth S. Collins, San Jose, CA (US);
Shahid Rauf, Pleasanton, CA (US);
Kartik Ramaswamy, San Jose, CA (US); Thorsten B. Lill, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 364 days.

(21) Appl. No.: 12/711,061

(22) Filed: Feb. 23, 2010

(65) Prior Publication Data

US 2010/0248488 A1 Sep. 30, 2010

Related U.S. Application Data

(60) Provisional application No. 61/211,256, filed on Mar. 26, 2009.

(51) Int. Cl.
*G01L 21/30* (2006.01)
*G01R 31/00* (2006.01)
(52) U.S. Cl. .......................................... 216/59; 216/58
(58) Field of Classification Search .................. None
See application file for complete search history.

(56) References Cited

U.S. PATENT DOCUMENTS

| 5,928,528 A * | 7/1999 | Kubota et al. ................. 216/67 |
| 2003/0132195 A1* | 7/2003 | Edamura et al. ............... 216/59 |
| 2008/0057222 A1* | 3/2008 | Ui ................................. 427/570 |
| 2008/0182416 A1* | 7/2008 | Collins et al. ................. 438/710 |

* cited by examiner

*Primary Examiner* — Shamim Ahmed
*Assistant Examiner* — Bradford Gates
(74) *Attorney, Agent, or Firm* — Robert M. Wallace

(57) ABSTRACT

Radial distribution of etch rate is controlled by controlling the respective duty cycles of pulsed VHF source power applied to the ceiling and pulsed HF or MF bias power on the workpiece. Net average electrical charging of the workpiece is controlled by providing an electronegative process gas and controlling the voltage of a positive DC pulse on the workpiece applied during pulse off times of the pulsed VHF source power.

9 Claims, 5 Drawing Sheets

PULSED PLASMA HIGH ASPECT RATIO DIELECTRIC PROCESS

CROSS-REFERENCE TO RELATED APPLICATIONS

This application claims the benefit of U.S. Provisional Application Ser. No. 61/211,256, filed Mar. 26, 2009 entitled PULSED PLASMA HIGH ASPECT RATIO DIELECTRIC ETCH PROCESS, by Ankur Agarwal, et al.

BACKGROUND

1. Technical Field

Disclosed embodiments concern plasma etch processes employed in etching dielectric layers on a workpiece such as a semiconductor wafer.

2. Background Art

Plasma etching of high aspect ratio dielectric structures on workpieces is hampered by problems of aspect ratio dependent etching, etch stop or twisting of etched features. This is due in part to competing polymer deposition and etch mechanisms using fluorocarbon etch chemistry. It is also due in part to negative charging of the structure walls and positive charging of the structure floor or bottom of the high aspect ratio openings from predominantly positive ion fluxes and unequal electron fluxes down the depth of the structure. There is a need to provide for more balanced positive and negative charging of the structure walls being etched to avoid an accumulation of a net charge.

A pulsed plasma is used in etching of non-dielectric materials (such as polysilicon) using electronegative species in the process gas, such as chlorine. Generally, pulsing of the plasma reduces the effective electron temperature. Plasma source power and bias power may be synchronously pulsed (same pulse repetition frequency) with pulses in phase (overlapping RF envelopes) or with phase lead or lag of the source and bias RF envelopes. To minimize charging effects of the workpiece structure where the material is not a good conductor, source and bias power may be pulsed synchronously, but with the bias "on" envelope applied when the source power is "off". The time window during which the pulsed source power is "off" may be referred to as the "decay phase" or the pulsed source power "off" phase. In a polysilicon plasma etch process using a process gas with electronegative chemistry such as $Cl_2$, negatively charged Cl ions may form during the "decay phase" when the source power is "off". Under appropriate conditions, the number density of negative ions may greatly exceed the number density of electrons, and be nearly equal to the number density of positive ions that form during the source power "on" phase. If the bias power is applied during the source power "off" phase, then the workpiece being etched may be bombarded with nearly equal fluxes of positive and negative ions during the two phases. Specifically, the workpiece is bombarded with predominantly positive ions during the source power "on" phase and with negative ions during the bias power "on" phase (i.e., source power decay or "off" phase). If the structure being etched is bombarded with alternating (per RF cycle) equal fluxes of oppositely charged (~equal mass) ions, then no net charging (time average) of the structure bottom should occur.

Etching of dielectric materials such as silicon dioxide selective to mask layers or underlayers is typically performed using a fluorocarbon chemistry, such as $CF_4$ or $C_4F_6$, in conjunction with an oxidizer such as $O_2$ or CO, and sometimes hydrogen or hydrocarbon chemistry as well. Typically, an electropositive gas such as Ar is added as a diluent. Unfortunately, the typical dielectric etch process gas chemistries do not form a significant population of negative ions; that is, the number density of electrons far exceeds the number density of negative ions. Consequently, there are unequal fluxes of oppositely charged ions to the workpiece or wafer, leading to charging of the workpiece structure. Pulsing the plasma decreases plasma-on time, which can limit at least to some degree the charge damage, because the collapsed sheath allows for neutralization of accumulated charge. However, that is not a complete solution to the charging problem. Moreover, it does not address a problem of non-uniform radial distribution of plasma ion density.

SUMMARY

A method of processing a workpiece supported on a workpiece support facing a ceiling in a reactor chamber, comprises introducing into the chamber a polymerizing etch gas, an electronegative gas and an oxidizer gas, applying source power in the VHF range to the ceiling and applying bias power in the HF or MF range to the wafer support, and pulsing the source power and pulsing the bias power, while establishing a phase lag between source and bias power pulses. The method further comprises applying a positive D.C. pulse to the workpiece support and/or a negative D.C. pulse to the ceiling during the pulse off time of the source power, adjusting an average accumulation of electric charge on the workpiece by adjusting the voltage of the D.C. pulse and adjusting the etch rate by adjusting the phase lag between the pulses of the source and bias power. The method further comprises adjusting etch rate distribution by adjusting the pulse duty cycles of the VHF source power and of the RF bias power relative to one another.

In one embodiment, the method further comprises further adjusting the average accumulation of electric charge on the workpiece by adjusting a flow rate of the electronegative gas. In one embodiment, generally the same pulse rate is maintained for both the source power and the bias power.

In a further embodiment the method further comprises adjusting the phase lag toward 90° to increase etch rate or toward 180° to decrease the etch rate.

In a related embodiment, the source power may include first and second VHF frequencies applied to the ceiling, the first VHF frequency being less than the second VHF frequency, and the method further comprises adjusting etch distribution by adjusting the power levels of the first and second VHF frequencies.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
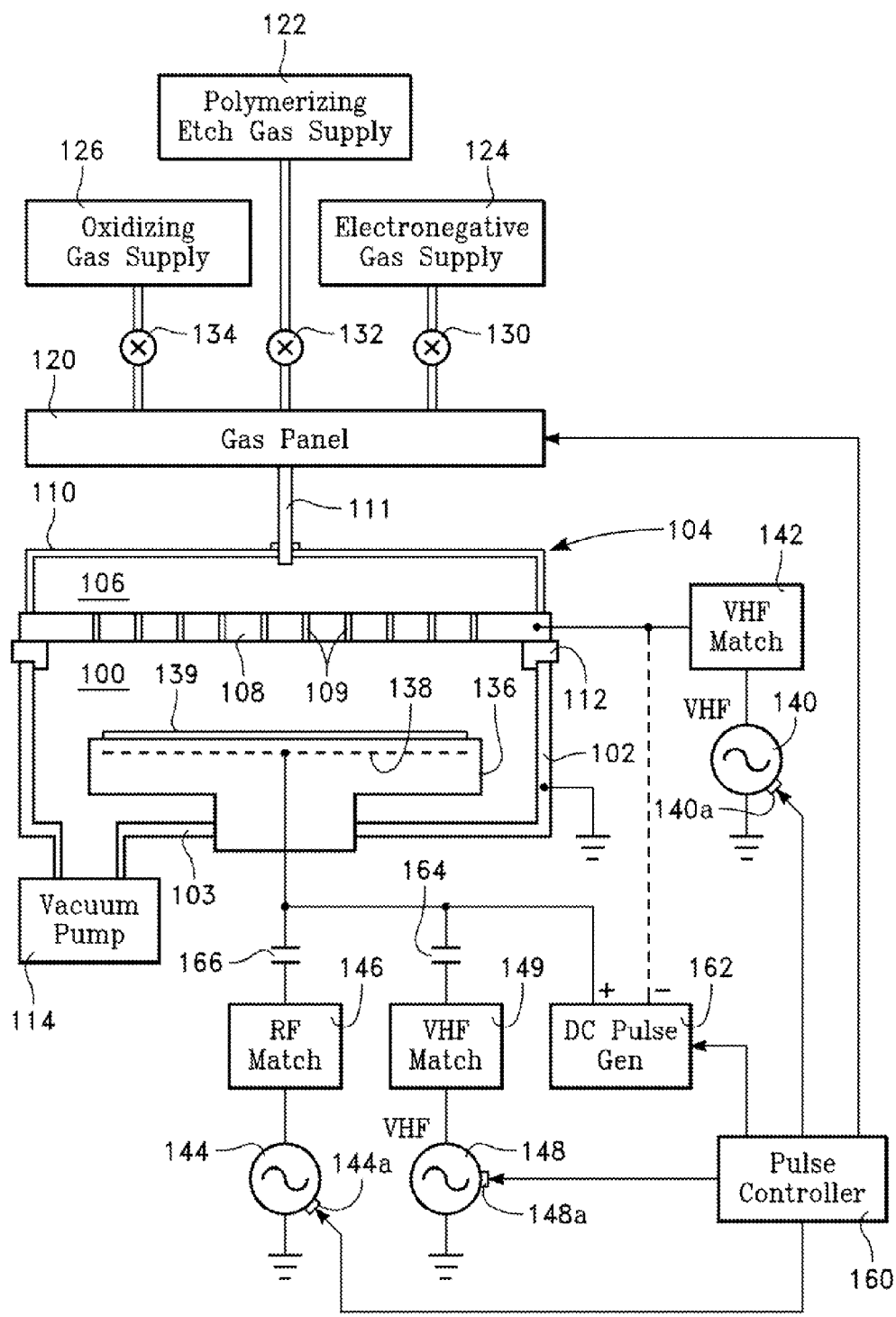
FIG. 1 depicts a processing system adapted to carry out a method in accordance with certain embodiments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Uniformity of the radial distribution of plasma ion density is improved in a pulsed RF plasma dielectric etch process. One embodiment uses the phase lead or lag of the RF envelopes of the pulsed RF source power and the pulsed RF bias power to improve uniformity. In this embodiment, VHF source power and HF (and/or MF) bias power are pulsed independently with a phase lead or lag between the source and bias power pulses. The plasma ion distribution responds differently to application of the different frequencies, enabling the ion distribution to be adjusted by adjusting the phase lead or lag. The different distributions attained during the different phases of each cycle average out over a complete cycle to a more uniform distribution. In one embodiment, a combination of a source power frequency in the low region of the VHF range (e.g., 60 MHz) is used in conjunction with a bias power frequency in the HF range (e.g., 13.56 MHz). The bias frequency may produce a predominantly higher edge plasma ion density, and the low region of the VHF range may produce a predominantly higher center region plasma ion density (i.e., over the workpiece center). A pulse repetition frequency of 6 KHz (166.67 µs pulse period) is used for the RF generators supplying the VHF source power and the HF bias power. By adjusting the overlap between the RF envelopes of the source power and bias power pulses, the plasma ion density non-uniformity can be minimized. This adjustment may be carried out as follows: if it is desired to make the ion distribution more center high, then the source and bias power pulse envelopes are adjusted to increase the source power "on" duty cycle relative to the bias power "on" duty cycle. If it is desired to make the ion distribution more edge high, then the source and bias power pulse envelopes are adjusted to increase the bias power "on" duty cycle relative to the source power "on" duty cycle.

In a pulsed RF plasma dielectric etch process, net charging of the thin film structure of the workpiece is reduced using a pulsed D.C. voltage. In one embodiment, this is accomplished by applying a pulsed D.C. voltage during a time window in which the pulsed VHF source power is "off" ("decay phase") and the pulsed HF bias voltage is "on". Since, in general, negative ions will form during the "decay phase", applying a positive pulsed D.C. voltage during the decay phase when the VHF source power is "off" (during which the negative ions are most plentiful) provides the necessary acceleration to the negative ions towards the structure being etched. The additional influx to the workpiece of negatively charged species during the pulsed source power "off" time will result in net neutralization of positive charge accumulated during the previous pulsed source power "on" time. The D.C. voltage may be on the order of tens or hundreds of volts, for example, and should be of a polarity that attracts the negative ions to the workpiece and particularly onto the side walls of high aspect ratio openings formed in the dielectric film that is being etched. In one case, this D.C. voltage pulse is a positive pulse applied to the wafer support pedestal or an electrode within the pedestal. In another case, this D.C. voltage pulse is a negative pulse applied to an overhead electrode or ceiling gas distribution showerhead or electrode. Alternatively, a positive pulse may be applied to the wafer support pedestal while a negative pulse is applied to the ceiling electrode.

In order to reduce net electrical charge accumulated on the workpiece, in a related aspect a plasma chemistry and environment can be created that forms a similar number density of negative ions during the source power "off" phase as positive ions are formed during the source power "on" phase. (The positive and negative ion densities formed during the two phases are similar but both are much greater than electron density.) During the pulsed source power "off" phase, the bias pulse "on" phase occurs, during which ion energy is sufficiently high to etch the workpiece structure. The provision of such a plasma chemistry is accomplished by the addition of a highly electronegative gas such as $Cl_2$ or HBr to the fluorocarbon or fluoro-hydrocarbon etch process gases. Alternatively, such a highly electronegative gas may completely replace the electropositive diluent gas such as Ar. Addition of the highly electronegative gas or gases provides more nearly equal alternating fluxes of negative and positive ion to the workpiece structure during the different pulse phases. This minimizes positive charging of the structure walls that leads to aspect ratio dependent etching, etch stop or twisting of features etched. We have found that good results (minimum net charging of the workpiece or on the bottom of each high aspect ratio opening) are obtained with the following flow rates: oxidizer gas, 200 sccm; fluorocarbon gas 100 sccm; halogen electronegative gas, 1000 sccm. In general, the oxidizer and fluorocarbon gas flow rates are of the same order of magnitude, while the electronegative gas flow rate should be about ten times greater.

Other halogen-containing gases may be used, but non-fluorine-containing are preferred, as excess fluorine radicals contribute to other problems such as profile bowing (chemical etching of sidewalls) or mask loss (faceting). The plasma source may be inductively or capacitively coupled, but a capacitively coupled source is preferred with fluorocarbon chemistry etching of high aspect ratio HAR) dielectric film structures (to minimize excessive dissociation of fluorocarbon and excessive fluorine radical generation). A capacitively coupled plasma source using VHF power is more preferred, and may be coupled to the workpiece support electrode or another chamber electrode, such as gas showerhead electrode. The VHF source frequency is typically 60 MHz or 162 MHz, for example. A negative D.C. voltage applied to the chamber electrode (such as the ceiling gas showerhead electrode) is preferred. Alternatively (or in addition) a positive D.C. voltage may be applied to the workpiece support electrode. The positive D.C. voltage pulse may be used independently or in conjunction with the addition of a highly electronegative gas. A magnetic field may be used to control plasma non-uniformity.

In one embodiment, a combination of a lower VHF frequency of 40 or 60 MHz is used in conjunction with a higher VHF frequency of 100 or 162 MHz. The lower frequency VHF may produce a predominantly higher edge plasma ion density, and the higher frequency VHF may produce a predominantly higher central region plasma ion density. The relative high and low frequency VHF power may be selected to minimize plasma ion density non-uniformity or etch-related non-uniformity. Bias power is applied to workpiece support, typically an electrostatic chuck, on a fixed or adjustable-position workpiece support electrode. Bias frequency is typically RF, preferably 13.56 MHz or lower. Lower bias frequency of 2 MHz or even 400 KHz may be more preferred, to maximize ion energy per unit power, or/and minimize plasma generation during bias-on pulse, which can lead to destruction of negative ions.

In one example, a combination of a medium frequency (e.g., 2 MHz) and high frequency (e.g., 13.56 MHz) bias is applied to the workpiece support electrode. In this example, a fluorocarbon gas such as $C_4F_6$ or $C_4F_8$, and oxidizer such as $O_2$ or CO, and an electronegative gas such as $Cl_2$ or HBr are supplied to the chamber through a gas showerhead, and the chamber pressure is maintained at 10 mtorr by throttling a turbo-molecular pump. Average source powers of 150 watt (162 MHz) and 2500 watt (60 MHz) are applied to the top and bottom electrodes, respectively. An average bias power of 7000 watt (2 MHz) is applied to the lower (workpiece) electrode. A pulse repetition frequency of 2 KHz (500 µs pulse period) is used for all RF generators. The source generators are synchronized (overlapping RF envelopes) with a 40% duty cycle. The bias generator is also operated at 40% duty cycle, with a pulse on-time delay of 50 µs following the source pulse turn-off.

FIG. 1 depicts a plasma reactor adapted to carry out the foregoing method. The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the plate 108. The gas manifold is enclosed by a manifold enclosure 110 having a gas supply inlet 111. The gas distribution showerhead 104 is electrically insulated from the cylindrical side wall 102 by an insulating ring 112. A vacuum pump 114, such a turbomolecular pump, evacuates the chamber 100. A gas panel controls the individual flow rates of different process gases to the gas supply inlet 111. A gas supply 122 containing a polymerizing etch gas suitable for dielectric etch processes (e.g., a fluorocarbon gas or a fluoro-hydrocarbon gas) is coupled to the gas panel 120. A gas supply 124 containing an electronegative gas, preferably a halogen-containing gas such as chlorine gas or hydrogen bromide gas, is coupled to the gas panel 120. A gas supply 126 containing an oxidizing gas, such as carbon monoxide or oxygen, is coupled to the gas panel 120. Optionally, gas flow from each of the gas supplied 122, 124, 126 may be controlled by individual valves 130, 132, 134 respectively. A workpiece support pedestal 136 supported through the chamber floor 103 may have an insulating top surface and an internal electrode 138. The internal electrode may, for example, be used for chucking a semiconductor workpiece 139 on the top surface of the support pedestal 136. Plasma source power is applied to the ceiling (gas distribution showerhead) 104 from a VHF generator 140 through a VHF impedance match 142. The ceiling or gas distribution showerhead is formed of a conductive material, such as aluminum for example, and therefore serves as a ceiling electrode. The VHF generator 140 may generate VHF power in the high portion of the VHF spectrum, such as in a range of 100 to 200 MHz. The VHF generator 140 has the capability of pulsing the VHF power it generates at a desired pulse rate and duty cycle. For this purpose, the VHF generator 140 has a pulse control input 140a for receiving a control signal or signals defining the pulse, rate and/or duty cycle as well as the phase of each pulse produced by the VHF generator 140.

Plasma bias power is applied to the wafer support electrode 138 from an RF generator 144 through an RF impedance match 146. The RF generator 144 may generate HF or LF power in the low portion of the HF spectrum or in the MF or LF spectrum, such as in a range of 13.56 MHz or a on the order of 1-2 MHz. The RF generator 144 has the capability of pulsing the RF power it generates at a desired pulse rate and duty cycle. For this purpose, the RF generator 144 has a pulse control input 144a for receiving a control signal or signals defining the pulse rate and/or duty cycle as well as the phase of each pulse produced by the RF generator 144.

Optionally plasma source power is also applied to the wafer support electrode 138 from a second VHF generator 148 through a VHF impedance match 149. The second VHF generator 148 may generate VHF power in the low portion of the VHF spectrum, such as in a range of 50 to 100 MHz. The second VHF generator 148 has the capability of pulsing the VHF power it generates at a desired pulse rate and duty cycle. For this purpose, the second VHF generator 148 has a pulse control input 148a for receiving a control signal or signals defining the pulse rate and/or duty cycle as well as the phase of each pulse produced by the second VHF generator 148.

A pulse controller 160 is programmable to apply pulse control signals to each of the pulse control inputs 140a, 144a, 148a of the RF generators 140, 144, 148, to produce the desired phase lag relationship among the pulses of the VHF source power generators 140, 148 and the RF bias power generator 144. In addition, a D.C. pulse generator 162 may be coupled to either (or both) the wafer support electrode 138 and the ceiling 104. The pulse repetition rate, phase and duty cycle of the D.C. pulse generator are controlled by the pulsed controller 160. A D.C. isolation capacitor 164, 166 may be provided to isolated each RF generator from the D.C. pulse generator 162.

Figure 2A:
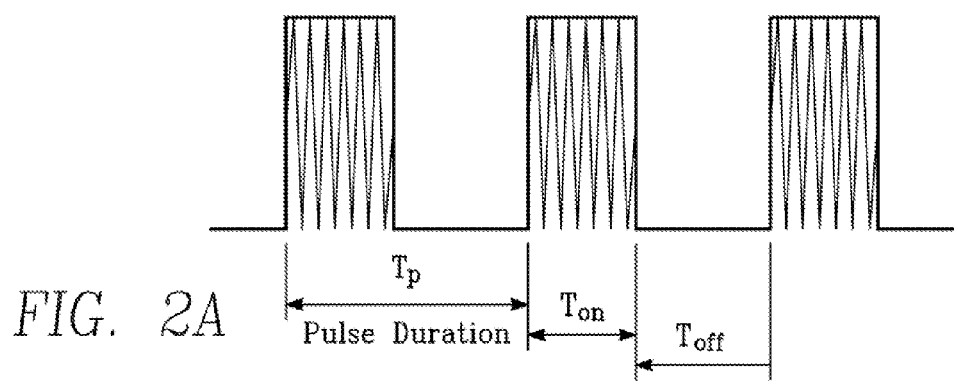
FIG. 2A is a time domain waveform diagram typical of the pulsed RF output of each of RF generators of FIG. 1.

FIG. 2A is a time domain waveform diagram typical of the pulsed RF output of each of the generators 140, 144, 148, showing the pulse envelope of the pulsed RF output, characterized by the following parameters controlled by the pulse controller 160 individually for each generator 140, 144, 148: a pulse duration, a pulse period $T_P$, a pulse "on" time $T_{ON}$, a pulse "off" time $T_{OFF}$, a pulse frequency $1/T_P$, and a pulse duty cycle $(T_{ON}/T_P) \cdot 100\%$.

Figure 2B:
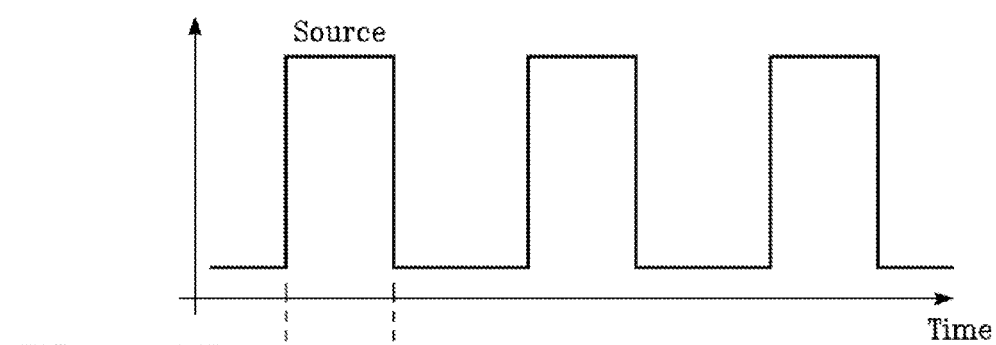
FIGS. 2B and 2C depict contemporaneous time domain waveforms of pulsed VHF source power and pulsed RF bias power, respectively, with a phase difference of zero between them.
Figure 2C:
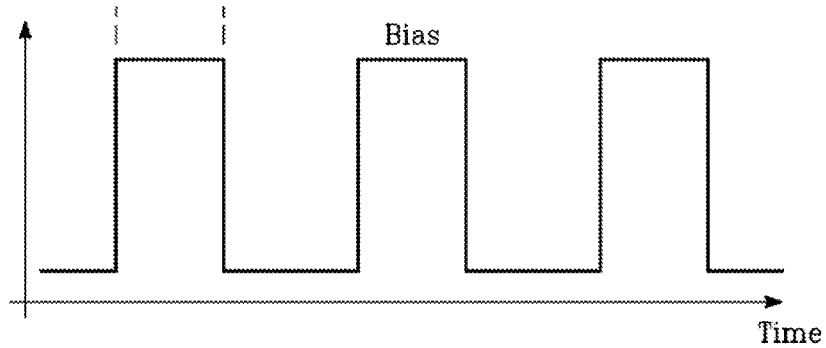
Figure 3A:
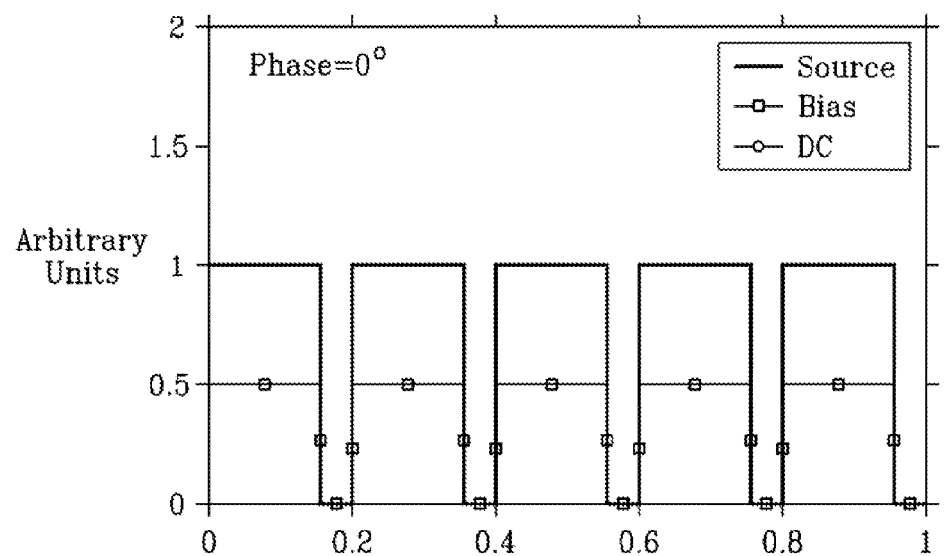
FIGS. 3A through 3D illustrate the superposition of the source and bias power waveforms at phase differences of 0°, 90°, 180° and 270°, respectively.
Figure 3B:
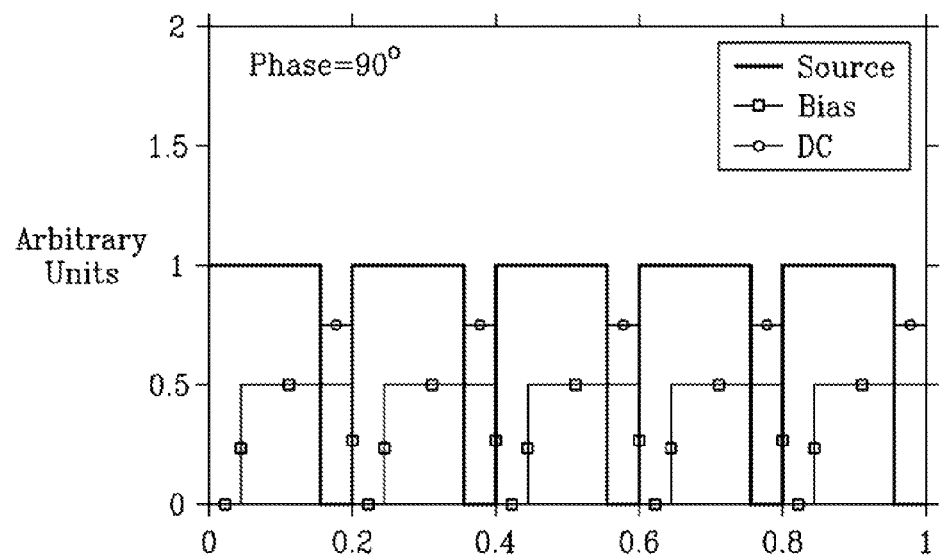
Figure 3C:
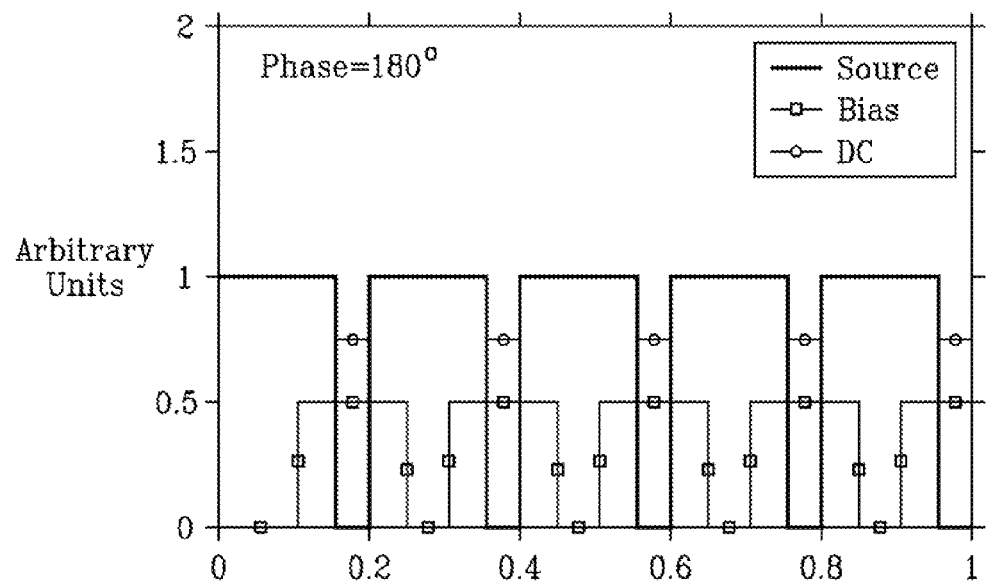
Figure 3D:
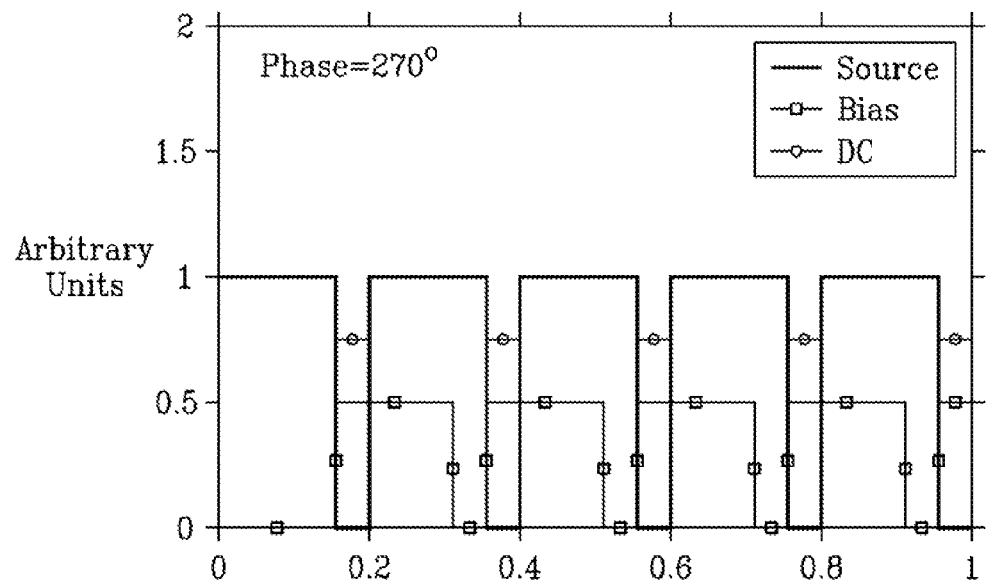

FIGS. 2B and 2C depict contemporaneous time domain waveforms of pulsed VHF source power and pulsed RF bias power synchronized together in such a manner that they have identical phase and duty cycle and therefore a phase difference of zero between them. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the bias pulse output lags the source pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180°. FIG. 3D depicts a case in which the bias power pulse output lags the source power pulse output by 270°. FIGS. 3A through 3D depict a duty cycle of 75% for all pulse outputs. However, the duty cycle may be less, for example about 40% for all pulse outputs. Moreover, in some implementations, the source and bias pulse outputs may have different duty cycles. For example, the VHF source power output from the VHF source power generators 140, 148 may be synchronized together with a duty cycle of 45% while the RF bias power generator may have a duty cycle of 35%.

During each "off" time of the VHF source power pulse output, a negative D.C. pulse may be applied to the wafer support electrode 138 and/or a positive D.C. pulse may be applied to the ceiling 104, from the D.C. pulse generator 162. This is depicted in the dotted line waveforms of FIGS. 3B, 3C and 3D. As discussed above, the purpose of this feature is to boost positive ion flux to the workpiece during the source power "off" time when positive ions are plentiful, to equalize the average flux of positive and negative ions over each complete cycle. This equalization may be optimized by controlling the voltage of the D.C. pulse generator 162.

The etch process rate is controlled or tuned by changing the phase lag between the source and bias pulse outputs. This is because the phase lag affects or tunes the ion energies and the fluxes at the workpiece surface. For example, for a phase lag of 90°, etch rates are higher as high energy ions will have a large flux. This is because the VHF source pulse is already "on" at the beginning of the bias pulse, which leads to high fluxes, and when the source pulse ends ("off"), then the on-phase of bias pulse leads to high ion energies. A similar analysis applies to other phase lags. For a phase lag of 180° although the ion energies will be higher (as the VHF source is off at the beginning of the bias power pulse), the flux will also be lower (because the source power pulse is off at the beginning of the bias power pulse in this case). As a result, the time-averaged ion fluxes are lower throughout the entire cycle so that the etch rate is expected to be low. It is expected to be lowest at 180° phase lag. A phase lag of 270° is similar in principle to a phase lag of 90°, so that the etch rate behavior will be similar, although the etch rate at 270° will be slightly less than at 90° phase lag. Therefore, the process etch rate is controlled by varying the phase between the VHF source power pulse output of the generators 140, 148 and the bias power pulse output of the generator 144.

Figure 4:
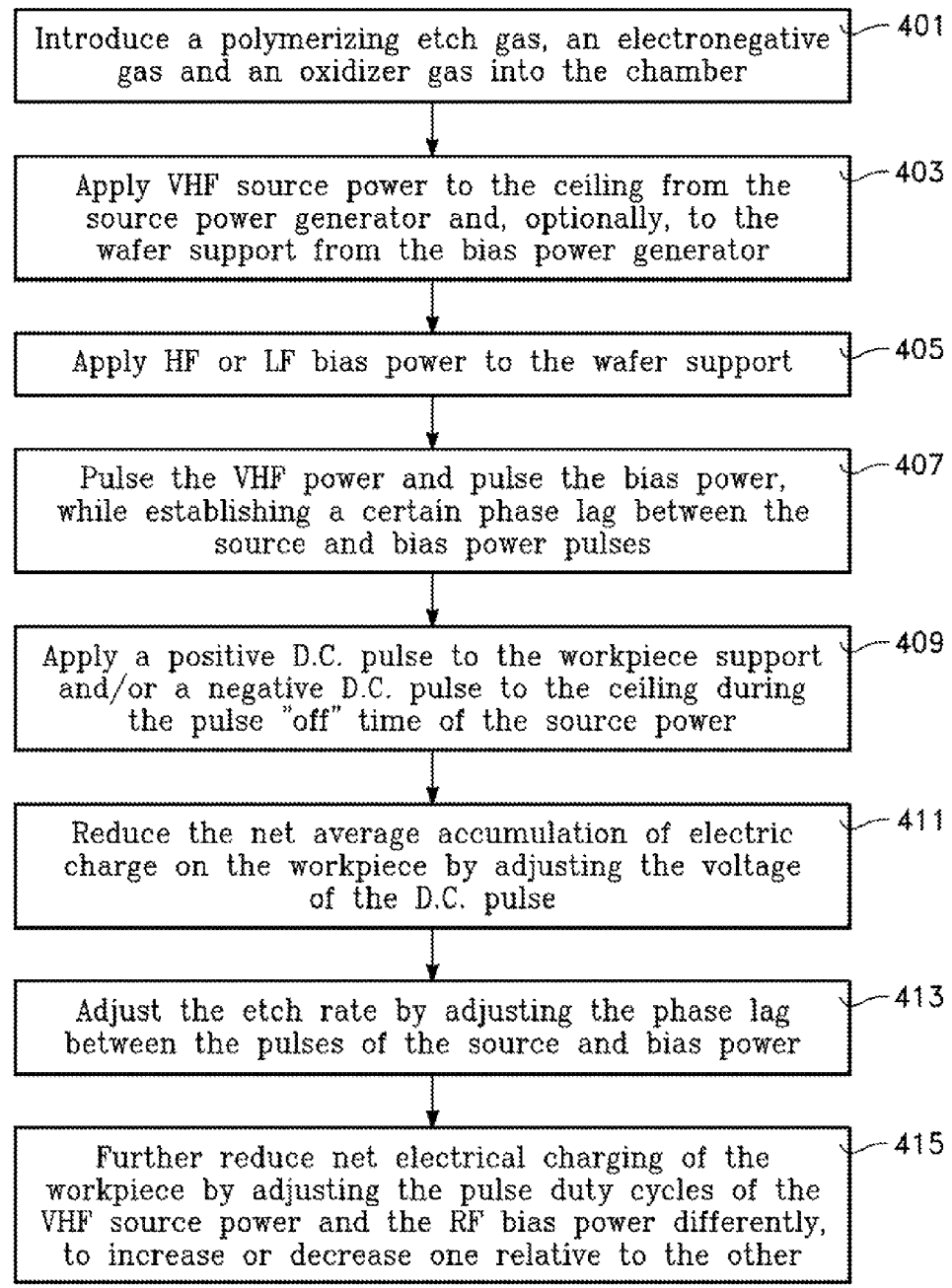
FIG. 4 depicts a method for etching high aspect ratio openings on a workpiece in accordance with an embodiment.

A method for etching high aspect ratio openings on a workpiece on the workpiece support 136 in the chamber 100 in accordance with one embodiment is illustrated in FIG. 4, and is as follows: Introduce a polymerizing etch gas, an electronegative gas and an oxidizer gas into the chamber (block 401 of FIG. 4). Apply VHF source power to the ceiling 104 from the generator 140 and, optionally, to the workpiece support 136 from the generator 148 (block 403). Apply HF or LF bias power to the wafer support (block 405). Pulse the VHF power and pulse the bias power, while establishing a certain phase lag between the source and bias power pulses (block 407), while maintaining generally the same pulse rate for both the source and bias power pulses. Apply a positive D.C. pulse to the workpiece support and/or a negative D.C. pulse to the ceiling (block 409) during the pulse "off" time of the source power. Reduce the net average accumulation of electric charge on the workpiece by adjusting the voltage of the D.C. pulse (block 411). Adjust the etch rate by adjusting the phase lag between the pulses of the source and bias power (block 413), in which phase lag is adjusted toward 90° to increase the etch rate or toward 180° to decrease the etch rate. In accordance with one embodiment, net electrical charging of the workpiece may be further reduced by adjusting the pulse duty cycles of the VHF source power and of the RF bias power differently, to increase or decrease one relative to the other (block 415).

As used in this specification, the terms very high frequency (VHF), high frequency (HF) and medium frequency (MF) correspond to frequency ranges defined in standard practice as falling between 30 and 300 MHz for VHF, between 3 and 30 MHz for HF and 300 kHz and 3 MHz for MF.

While the foregoing is directed to embodiments of the present invention, other and further embodiments of the invention may be devised without departing from the basic scope thereof, and the scope thereof is determined by the claims that follow.

What is claimed is:

1. A method of processing a workpiece supported on a workpiece support facing a ceiling in a reactor chamber, comprising:
   introducing into the chamber a polymerizing etch gas, an electronegative gas and an oxidizer gas;
   applying source power in the VHF range to the ceiling and applying bias power in the HF or MF range to the wafer support;
   pulsing said source power and pulsing said bias power, while establishing a phase lag between source and bias power pulses;
   applying a positive D.C. pulse to the workpiece support and/or a negative D.C. pulse to the ceiling during the pulse off time of the source power;
   adjusting an average accumulation of electric charge on the workpiece by adjusting the voltage of the D.C. pulse;
   adjusting the etch rate by adjusting the phase lag between the pulses of the source and bias power;
   adjusting etch rate distribution between center-high and edge-high by adjusting the pulse duty cycles of the VHF source power and of the RF bias power relative to one another, said adjusting etch rate distribution comprising at least one of:
   (a) rendering said etch rate distribution more center-high by increasing the pulse duty cycle of said source power relative to the pulse duty cycle of said bias power, and
   (b) rendering said etch rate distribution more edge-high by increasing the pulse duty cycle of said bias power relative to the pulse duty cycle of said source power.

2. The method of claim 1 further comprising:
   further adjusting said average accumulation of electric. charge on the workpiece by adjusting a flow rate of said electronegative gas.

3. The method of claim 1 further comprising maintaining generally the same pulse rate for both said source power and said bias power.

4. The method of claim 1 further comprising adjusting said phase lag toward 90° to increase etch rate or toward 180° to decrease the etch rate.

5. The method of claim 1 wherein said applying source power comprises applying first and second VHF frequencies to said ceiling, said first VHF frequency being less than said second VHF frequency, said method further comprising:
   further adjusting etch distribution by adjusting the power levels of said first and second. VHF frequencies.

6. A method of processing a workpiece supported on a workpiece support facing a ceiling in a reactor chamber, comprising:
   introducing into the chamber a polymerizing etch gas, an electronegative gas and an oxidizer gas;
   applying source power in the VHF range to the ceiling and applying bias power in the HF or MF range to the wafer support;
   pulsing said source power and pulsing said bias power, while establishing respective pulse duty cycles of source power pulses and bias power pulses;
   applying a positive D.C. pulse to the workpiece support and/or a negative D.C. pulse to the ceiling during the pulse off time of the source power;

adjusting an average accumulation of electric charge on the workpiece by adjusting the voltage of the D.C. pulse;

adjusting the etch rate distribution between a center high distribution and an edge high distribution by adjusting the duty cycles of said source power and bias power relative to one another, said adjusting etch rate distribution comprising at least one of:
(a) rendering said etch rate distribution more center-high by increasing the pulse duty cycle of said source power relative to the pulse duty cycle of said bias power, and
(b) rendering said etch rate distribution more edge-high by increasing the pulse duty cycle of said bias power relative to the pulse duty cycle of said source power.

7. The method of claim 6 further comprising:
further adjusting said average accumulation of electric charge on the workpiece by adjusting a flow rate of said electronegative gas.

8. The method of claim 6 further comprising maintaining generally the same pulse rate for both said source power and said bias power.

9. The method of claim 6 wherein said applying source power comprises applying first and second VHF frequencies to said ceiling, said first VHF frequency being less than said second VFH frequency, said method further comprising:
further adjusting etch distribution by adjusting the power levels of said first and second VHF frequencies.

* * * * *